United States Patent [19]

Yamamoto et al.

[11] 4,442,195

[45] Apr. 10, 1984

[54] PHOTOSENSITIVE COMPOSITION AND ARTICLE WITH O-QUINONE DIAZIDE AND 6-MEMBERED CYCLIC ACID-ANHYDRIDE

[75] Inventors: Takeshi Yamamoto; Kiyoshi Goto, both of Hino, Japan

[73] Assignee: Konishiroku Photo Industry Co., Ltd., Tokyo, Japan

[21] Appl. No.: 395,976

[22] Filed: Jul. 7, 1982

[30] Foreign Application Priority Data

Jul. 15, 1981 [JP] Japan ............................ 56-111000

[51] Int. Cl.$^3$ .................... G03C 1/60; G03C 1/54
[52] U.S. Cl. ................................ 430/191; 430/165; 430/190; 430/192; 430/302
[58] Field of Search ............. 430/191, 192, 190, 165, 430/302

[56] References Cited

U.S. PATENT DOCUMENTS

| | | | |
|---|---|---|---|
| 3,016,298 | 1/1962 | Sanders et al. | 430/149 |
| 4,009,033 | 2/1977 | Bakos et al. | 430/191 |
| 4,115,128 | 9/1978 | Kita | 430/191 |
| 4,294,905 | 10/1981 | Okishi et al. | 430/192 |
| 4,307,173 | 12/1981 | Gventer | 430/193 |

OTHER PUBLICATIONS

Kosar, J., "Light-Sensitive Systems", J. Wiley & Sons, 1975, p. 257.

*Primary Examiner*—Charles L. Bowers, Jr.
*Attorney, Agent, or Firm*—Jordan B. Bierman; Linda Bierman

[57] ABSTRACT

A photosensitive composition for making lithographic printing plate and for use as a photoresist material which comprises a photosensitive o-quinone diazide compound, an alkali-soluble resin, and 0.5 to 20% by weight 6-membered cyclic acid anhydride.

12 Claims, No Drawings

PHOTOSENSITIVE COMPOSITION AND ARTICLE WITH O-QUINONE DIAZIDE AND 6-MEMBERED CYCLIC ACID-ANHYDRIDE

The present invention relates to a photosensitive composition for lithographic printing plates commonly referred to a photolithographic printing plates, and for photoresist material which has high sensitivity, excellent chemical resistance, and a long press life.

It is known that o-quinone diazide compound decomposes to produce a five-membered carboxylic acid and becomes alkali-soluble by irradiation with an active light. Accordingly, an o-quinone diazide compound is popularly used in lithographic printing plate materials, photoresist materials and the like to serve as a photosensitive component for obtaining positive-positive type images. Further, a photosensitive composition in which the o-quinone diazide compound and an alkali-soluble resin, such as novolak resin, are generally used as mixtures which increase the mechanical strength and the chemical resistance of the image area.

The photosensitive compositions of this kind are lower in photosensitivity in comparison with negative working photosensitive materials utilizing the photo-crosslinking reaction. This results in the need for greater light exposure in the plate-making process at the expense of working time. Therefore, improvement in working efficiency is desirable.

A variety of attempts have been made to increase the photosensitivity of the mixture comprising an o-quinone diazide compound and alkali-soluble resin. For example, in Japanese Patent Examined Publication No. 19619/1981 a method is described in which photosensitivity is increased by adding a hydantoin and o-benzoic sulfimide. Compounds of this kind have not proved successful thus far and, in addition, use of the hydantoin has a disadvantage; it narrows the development latitude. Further, Japanese Patent Publication Open to Public Inspection No. 73045/1980 indicates that the condensation products of hydroxy benzophenone and formaldehyde may be added. However, this method has the drawback that, since a large amount of the condensation products must be added, the solubility of an unexposed area in the developing solution is increased and development latitude narrows.

Still further, Japanese Patent Publication Open to Public Inspection No. 80022/1977 describes the addition of a five-membered cyclic acid-anhydride such as phthalic anhydride, maleic anhydride and the like. This has been the most effective method for increasing the sensitivity among the various methods studied. However, in its application to a lithographic printing plate material, the above-mentioned five-membered cyclic acid-anhydride causes narrowing of the development latitude, especially when stored at high temperature and/or humidity. This problem arises evn in the absence of high temperature or humidity if storage is prolonged. The printing image area is apt to be damaged by various materials used in the printing process, such as chemicals for removing stains, gumming up, etc. as well as dampening water containing alcohol. This renders multiple printings impossible.

Accordingly, it is an object of the invention to provide a photosensitive composition wherein the above-mentioned defects are remedied; thereby improving sensitivity, preservability, and processing chemical resistance. When applied to a lithographic printing plate material, the press life is maintained, even when stored for substantial periods of time.

The Inventors have found that these objects can be attained with a photosensitive composition containing an o-quinone diazide compound, an alkali-soluble resin and a six-membered cyclic acid-anhydride.

An o-quinone diazide compound of this invention is a compound having at least one o-quinone diazide group (preferably o-benzoquinone or o-naphthoquinone diazide) per molecule, including the compounds described in J. Kosar, "Light Sensitive Systems", John Wiley & Sons, Inc. 1965, pp. 339–353.

For the o-quinone diazide compound, the esters of a hydroxyl compound and an o-quinone diazide sulfonic acid, preferably an o-naphthoquinone diazide, are particularly suitable. Preferable hydroxyl compounds are condensation resins of a phenol and a carbonyl group containing compound, particularly the resins obtained through the condensation in the presence of an acid catalyst. Preferred phenols include phenol, cresol, and pyrogallol, and the carbonyl group containing compounds include formaldehyde, benzaldehyde, and acetone.

Particularly preferable hydroxyl compounds are phenol formaldehyde resins, cresol formaldehyde resins, pyrogallol acetone resins, and resorcin benzaldehyde resins.

Typical examples of an o-quinone diazide compound are the ester of benzoquinone-(1,2)-diazide sulfonic acid or naphthoquinone-(1,2)-diazide sulfonic acid and phenol formaldehyde resin or cresol formaldehyde resin; the ester of naphthoquinone-(1,2)-diazide-(2)-5-sulfonic acid and the resorcin-benzaldehyde resin described in Japanese Patent Publication Open to Public Inspection No. 1044/1981; the ester of naphthoquinone-(1,2)-diazide sulfonic acid and pyrogallol acetone resin described in U.S. Pat. No. 3,635,709; and the ester of naphthoquinone-(1,2)-diazide-(2)-5-sulfonic acid and resorcin-pyrogallol-acetone copolymeric condensation product described in Japanese Patent Publication Open to Public Inspection No. 76346/1980.

Other useful o-quinone diazide compounds include polyesters having a hydroxyl group at the end esterified with an o-naphthoquinone diazide sulfonyl chloride described in Japanese Patent Publication Open to Public Inspection No. 117503/1975; p-hydroxy styrene homopolymer or a copolymer of p-hydroxy styrene with other copolymerizable monomers esterified with an o-naphthoquinone diazide sulfonyl chloride described in Japanese Patent Publication Open to Public Inspection No. 113305/1975; the ester of o-quinone diazide sulfonic acid and bisphenol-formaldehyde resin described in Japanese Patent Examined Publication No. 29922/1979; the condensation product of o-quinone diazide sulfonyl chloride and the copolymer of alkylacrylate, acryloyloxyalkyl carbonate and hydroxyalkyl acrylate described in U.S. Pat. No. 3,859,099; the reaction product of o-quinone diazide sulfonic acid and a copolymerization product of styrene and a phenol derivative described in Japanese Patent Examined Publication No. 17481/1974; an amide of a copolymer of p-amino-styrene and other copolymerizable monomers and o-naphthoquinone diazide sulfonic acid or o-naphthoquinone diazide carbonic acid described in U.S. Pat. No. 3,759,711, and the ester of o-naphthoquinone diazide sulfonyl chloride and polyhydroxybenzophenone.

The content of the o-quinone diazide compounds is preferably 5.0–80% by weight relative to the total amount of solid components in the photosensitive composition, more preferably 10–50% by weight.

For the alkali-soluble resins, it is preferable to use the condensation product of a phenol and an aldehyde in presence of an acid catalyst. The phenols include phenol, cresol, p-substituted phenol, and the like. Formaldehyde is the preferred aldehyde. The most desirable alkali-soluble resins are the so-called novolak resins, which are obtained by the condensation of a phenol and formaldehyde; examples thereof are phenol formaldehyde resins, cresol formaldehyde resins, phenol cresol formaldehyde resins as described in Japanese Patent Publication Open to Public Inspection No. 57841/1980, and copolymeric condensation resins of p-substituted phenol, phenol or cresol and formaldehyde as described in Japanese Patent Publication Open to Public Inspection No. 127553/1980. The alkali-soluble resin in the invention is preferably present in an amount of 30–90% by weight, more preferably 50–85% by weight, relative to the whole amount of the solid components in the photosensitive composites.

Further, the six-membered cyclic acid-anhydrides to be used in the invention are defined as compounds having the six-membered ring containing

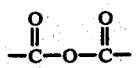

which serves as a ring forming element in the molecule. Said six-membered cyclic acid-anhydrides may either be condensed ring compounds, a low molecular weight compound or a macromolecular weight compound such as a polymer.

The preferable six-membered cyclic acid-anhydrides for a low molecular weight compound are formularized as in the following Formula (I):

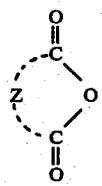

Formula (I)

wherein, Z represents a non-metal atoms necessary for forming a six-membered ring, together with

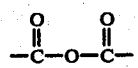

Z may be allowed to contain not only a carbon atom but a hetero atom such as an oxygen atom, and the six-membered ring to be formed by Z may also be either a saturated ring or an unsaturated ring.

The six-membered cyclic acid-anhydrides indicated by the following Formula (II) or (III) are preferable among those within Formula (I):

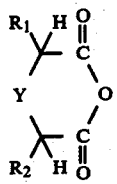

Formula (II)

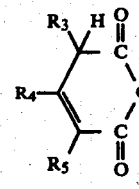

Formula (III)

wherein, Y represents an oxygen atom or a methylene group; and $R_1$, $R_2$, $R_3$, $R_4$ and $R_5$ each represents a hydrogen atom, an alkyl group, an aryl group or a halogen atom. A methylene group represented by Y may have a substituent; for example, an alkyl group, an aryl group, a halogen atom and the like.

The alkyl or aryl group represented by $R_1$, $R_2$, $R_3$, $R_4$ or $R_5$ and the alkyl and aryl group substituent on the methylene group represented by Y can further have a substituent respectively. The substituents in this case are, for example, a halogen atom, an alkyl group, such as methyl group and propyl group; an alkoxy group, such as methoxy group and isopropoxy group; and an aryl group, such as phenyl group and tolyl group.

On the other hand, the six-membered cyclic acid-anhydrides preferably serving as a macromolecular compound are polymers having the six-membered cyclic acid-anhydride structure characterized by the afore-given formula (I) in the molecule.

Said polymers may have a six-membered cyclic acid-anhydride structure in the principal chain or in the side chain thereof. Said polymers may also be copolymers having two or more kinds of six-membered cyclic acid-anhydride structure units. Examples of polymers having six-membered cyclic acid-anhydride structures in the principal chain thereof are the polymers having the monomer unit shown by the following Formula (IV):

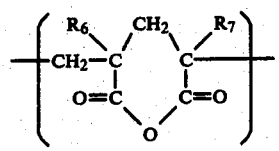

Formula (IV)

wherein, $R_6$ and $R_7$ each represents a hydrogen atom, a halogen atom or an alkyl group. The alkyl groups represented by $R_6$ and $R_7$ may also have a halogen atom, an aryl group, such as a phenyl group and the like as a substituent.

The molecular weight of said polymer is 1,000–50,000 suitably, and more preferably 15,000–30,000.

Next, the six-membered cyclic acid-anhydrides of the invention will be specifically exemplified hereunder but it is understood that the invention shall not be limited thereto.

[Exemplified Compounds]

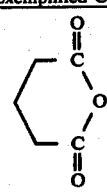

(1)

-continued
[Exemplified Compounds]

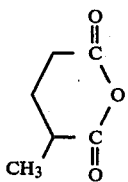

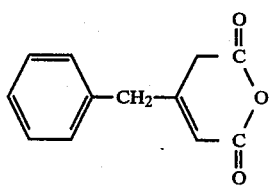

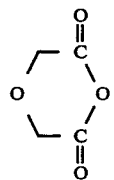

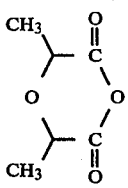

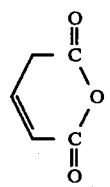

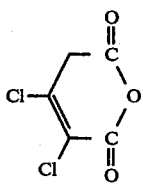

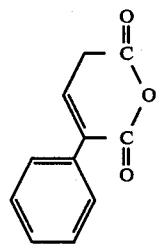

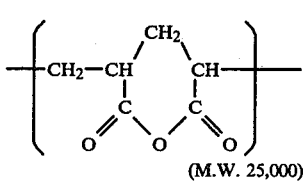
(M.W. 25,000)

-continued
[Exemplified Compounds]

(2)

(3)

(4)

(5)

(6)

(7)

(8)

(9)

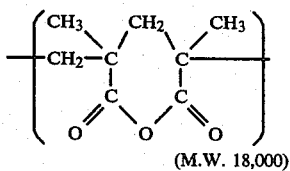
(M.W. 18,000)

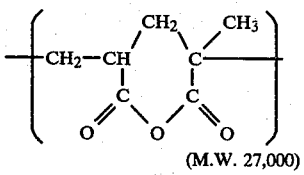
(M.W. 27,000)

(10)

(11)

The following is the description of the synthesizing process of the above-mentioned six-membered cyclic acid-anhydrides: The compounds indicated by Formula (I) are prepared by heating the corresponding dicarboxylic acid to be cyclized on dehydration together with acetyl chloride, acetic anhydride or the like. The six-membered cyclic acid-anhydrides, which are polymers, are prepared as described in C. G. Overberger, "Macromolecular Synthesis", vol. 1, pp. 38-, John Wiley & Sons, Inc. 1963, so that an acrylic anhydride or a methacrylic anhydride is cyclopolymerized. Among said six-membered cyclic acid-anhydrides the compounds represented by the Formula (II) are preferable, ones represented by the Formula (II) wherein Y is a methylene group are more preferable and glutaric anhydride is most preferable. The amount added of said six-membered cyclic acid-anhydride is preferably at 0.5–20% by weight, particularly 1–8% by weight, and most preferably 2–5% by weight, based on the whole amount of the solid components in the photosensitive composite. The sensitization effect requires at least 0.5% by weight of the amount added and the development latitude requires no more than 20% by weight.

In addition to the aforesaid ingredients, a variety of additives may be further added into the photosensitive compositions of the invention as occasion demands. For example, for the purpose of improving the ink-acceptability, lipophilic phenol.formaldehyde resin and p-substituted phenol.formaldehyde resin can be added as described in Japanese Patent Examined Publication No. 5083/1975, Japanese Patent Publication Open to Public Inspection No. 36206/1975, U.S. Pat. No. 4,123,279 and others. Substituents on the p-substituted phenol formaldehyde resin may be, for example, an alkyl group having 4–10 carbon atoms, such as t-butyl, t-amyl, octyl, benzyl and cumyl groups and the like, and an aryl group, such as phenyl and tolyl groups and the like.

There can also be used effectively a condensation product of the aforesaid phenol.formaldehyde resin and an o-quinone diazide compound having a halogeno-sulfonyl group.

Further, a cellulose alkyl ether, an ethylene oxide surface active agent or a fluorinated surface active agent for improving the coating property can be added.

Furthermore, a plasticizer can be added for improving the flexibility of the coating. For example, it is effective to add a phthalate ester such as dibutyl phthalate and dioctyl phthalate, a glycolate ester such as butyl glycolate, and ethylphthalyl ethyl glycolate, a phosphate ester such as triphenyl phosphate and tricresyl phosphate, an ester of aliphatic dibasic acid such as dioctyl adipate.

Still further, it is possible to add a print-out material for forming a visible image through exposure to light. Said print-out material is composed of a compound producing an acid or a free radical through exposure to light and an organic dye of which the color tone is changeable through interaction with said acid or radical. The compounds producing an acid or a free radical on exposure to light include o-naphthoquinone diazide-4-sulfonyl halogenide described in Japanese Patent Publication Open to Public Inspection No. 36209/1975, trihalomethyl-2-pyrone and trihalomethyl-triazine described in Japanese Patent Publication Open to Public Inspection No. 36223/1978, an ester or an amide of o-naphthoquinone diazide-4-sulfonyl chloride and a phenol or an aniline having an electron attractive substituent described in Japanese Patent Publication Open to Public Inspection No. 6244/1980, a halomethylvinyl oxadiazole compound described in Japanese Patent Publication Open to Public Inspection No. 77742/1980 and a diazonium salt or the like.

Examples of the organic dyes are Victoria Pure Blue BOH (mfd. by Hodogaya Chemical Ind. Co., Ltd.), Patent Pure Blue (mfd. by Sumitomo Mikuni Chemical Ind. Co., Ltd.), Oil Blue #603 (mfd. by Orient Chemical Ind. Co., Ltd.), Sudan Blue II (mfd. by BASF), Crystal Violet, Malachite Green, Fuchsine, Methyl Violet, Ethyl Violet, Methyl Orange, Brilliant Green, Congo Red, Eosine, Rhodamine 6G, or the like. And, with the purpose of improving the adhesion of a photosensitive layer to a support thereof, it is possible to add an adhesion reinforcer such as a silane coupling agent (e.g.; an aminoalkoxy silane compound) described in Japanese Patent Publication Open to Public Inspection No. 52002/1976.

Further, for the purpose of improving the abrasion resistance of a photosensitive layer arranged by coating the photosensitive composition of the invention, it is possible to add a lipophilic macromolecular compound such as an epoxy resin, a copolymer of vinyl chloride and vinyl acetate, polyvinylidene chloride, polyvinyl acetate, ethyl cellulose, acetyl butyl cellulose, polyurethane, or the like.

The photosensitive compositions of the invention are dissolved by a solvent capable of dissolving the aforesaid components and then coated on a support. Usable solvents are methyl cellosolve, ethyl cellosolve, methyl cellosolve acetate, ethyl cellosolve acetate, cyclohexane, methyl ethyl ketone, toluene, cyclohexanone, ethylene dichloride, ethyl acetate, dimethyl formamide, dimethyl sulfoxide and the like, and they are used individually or in combinations thereof. The suitable concentation of the solid components in a coating solution is 2 to 50% by weight. The solid components, in solution, are coated at the rate of 0.5-5 $g/m^2$, and preferably 1.5-3 $g/m^2$ in the common case of a lithographic printing plate material. As for the coating methods, any conventionally known ones are applicable; for example, whirl coating, wire-bar coating, dipping coating, air-knife coating, roller coating, blade coating, curtain coating, and the like.

The supports onto which the photosensitive compositions of the invention are coated are those such as a metallic plate of aluminium, zinc, copper and the like, a metal vacuum evaporated with zinc, copper, chrome and the like, a paper sheet, a plastic film, a paper sheet or a plastic film on which a metal was vacuum evaporated, a glass plate, and the like. The most preferable one is an aluminum plate. In the case of an aluminium plate support in particular, it is preferable to treat the surface thereof, as by graining, desmut treatment, anodizing, sealing if necessary, or the like. Any publicly known treatments can be applied thereto. Graining treatments are, for example, a mechanical surface graining treatment such as a brush graining, a ball graining and the like, a chemical graining, an electrolytic etching, a combination treatment of said mechanical graining and an electrolytic graining, and the like.

As for the desmut treatments, an alkaline etching treatment, an acid etching treatment, and the like are examples. Anodizing is carried out by passing electric current through an aluminum plate serving as an anode in either an aqueous solution or a non-aqueous solution in which an inorganic acid such as phosphoric acid, chromic acid, boric acid, sulfuric acid, or the like, or, an organic acid such as oxalic acid, sulfamic acid, or the like is individually dissolved. Alternatively, two or more of the foregoing can be used. Further, a sealing treatment is carried out by dipping in an aqueous solution of sodium silicate, hot water and a hot aqueous solution of several inorganic or organic salts, or by a steam bath thereof.

A lithographic printing plate material coated with a photosensitive composition of the invention is exposed to a light such as a carbon-arc lamp, a mercury lamp, a metal halide lamp, a xenon lamp, a tungsten lamp or the like, through a transparent positive film and then developed with an alkaline solution, and thus only the layer in the unexposed area remains on the surface of the support to produce a positive-positive type relief image. The developing solutions to be used for the developments may be any kind of an alkaline solution; examples of the alkaline solutions are solutions of sodium hydroxide, potassium hydroxide, calcium hydroxide, sodium carbonate, potassium carbonate, sodium metaborate, sodium triphosphate, sodium diphosphate, sodium metasilicate, sodium formate, or the like. As occasion demands, it is possible to add an anionic or an ampfoteric surface active agent, or an organic solvent such as alcohol, to the developing solution.

The lithographic printing plate materials and the photoresist materials each having the photosensitive composition of the invention within the photosensitive layer thereof are high in photosensitivity and excellent in storage stability under high temperature and humidity. In the case of said lithographic printing plate materials, they are only slightly affected by various kinds of processing chemicals, such as dampening water containing alcohol and do not exhibit any lowering of the press life, so that a great number of excellent prints can be obtained. The following examples more specifically describe the invention. It is however understood that the embodiments of the invention shall not be limited thereto.

EXAMPLE 1

A sheet of aluminium plate was degreased by dipping in 20% aqueous solution of sodium phosphate and was then electrolytically etched in a 0.2 N hydrochloric acid bath at a current density of 3 $A/dm^2$, and then anodized in a sulfuric acid bath. The amount anodized at that time was 2 $g/m^2$. The anodized aluminium plate thus treated was hot-water sealed producing an aluminum sheet 0.24 mm thick, Plate-1, as a support for the lithographic printing plate material. The photosensitive solution having the following composition was coated onto Plate-1 by means of a whirl coating machine, and was dried for four minutes at 100° C., to obtain a lithographic printing plate. (Composition of the photosensitive solution) The condensation product of naphthoquinone-(1,2)-diazide-(2)-5-sulfonyl chloride and resorcin-benzaldehyde resin (i.e.; prepared according to Example 1 in Japanese Patent Publication Open to Public Inspection No. 1044/1981)

|  |  |
|---|---|
|  | 3.5 g |

Copolymeric condensation resin of phenol.m-, p-mixed cresol.formaldehyde (in which the molar ratio of the phenol to the cresol is 3:7, and the average molecular weight thereof is 1500)

| | |
|---|---|
| | 8.0 g |
| Naphthoquinone-(1,2)-diazide-(2)-4-sulfonyl chloride | 0.15 g |
| Oil Blue #603 (mfd. by Orient Chemical Ind. Co., Ltd.) | 0.2 g |
| Exemplified Compound (1) | 0.58 g |
| Methyl cellosolve | 100.0 g |

The amount coated was approx. 2.7 g/m² after drying.

A step-tablet for measuring sensitivity (mfd. by Eastman Kodak Co.,-No. 2-which is divided into 21 steps, each of 0.15 density) was contacted with the surface of the lithographic printing plate material thus prepared, and exposed using the light source of a metal halide lamp of 2 KW (mfd. by Iwasaki Electric Co., Ltd. Eyedolphin 2000) at a distance of 1 m. It was developed with a 4% aqueous solution of sodium metasilicate at 25° C. for 45 seconds, and thus the sensitivity was measured.

Exposure time was determined so that the area corresponding to the 4th step of the grey-scale was completely developed (i.e.; the 4th step area was developed so as to be clear.). Meanwhile, to investigate chemical resistance and press life after preservation, the lithographic printing plate material was preserved under torture testing conditions (i.e.; a six-day preservation at 55° C. and 2% humidity, and a six-day preservation at 40° C. and 80% humidity), exposed and developed. The processing chemical resistance test was then carried out to determine the materials' resistance to an aqueous solution of isopropyl alcohol which is used in a Dahlgren damping system.

A printing plate having an image with the density gradation corresponding to the steps of the aforesaid grey-scale was dipped into a 35% aqueous solution of isopropyl alcohol for 24 hours at room temperature, washed with water and the image area was rubbed with a piece of wet absorbent cotton. The degree of the erosion in the image area affected by processing chemicals was compared with the same area before it was dipped into the isopropyl alcohol solution.

To test press life, the printing plate was mounted on an off-set printing machine (Komori Sprint L-25B). The printer was operated until the image area was too damaged to proceed further and the number of prints obtained at that time were evaluated.

CONTROL EXAMPLE 1

A lithographic printing plate material was prepared as in Example 1, except that Exemplified Compound (1) was not added. With respect to the lithographic printing plate material thus prepared, the sensitivity measurements, the processing chemical resistance tests after preservation, and the press lift tests thereof were carried out similarly to Example 1.

CONTROL EXAMPLE 2

A lithographic printing plate material was prepared as in Example 1, except that 0.58 g of $\Delta^4$-tetrahydrophthalic anhydride described in Example 1 of Japanese Patent Publication Open to Public Inspection No. 80022/1977 was used in place of Exemplified compound (1) in Example 1 hereof. With respect to the lithographic printing plate material thus prepared, the sensitivity measurements, the processing chemical resistance tests after preservation, and the press life tests thereof were carried out similarly to Example 1 herein.

CONTROL EXAMPLE 3

A lithographic printing plate material was prepared as in Example 1, except that 0.58 g of maleic anhydride described in Example 2 of Japanese Patent Publication Open to Public Inspection No. 80022/1977 was used in place of Exemplified Compound (1) in Example 1 herein. With respect to the lithographic printing plate material thus prepared, the sensitivity measurements, the processing chemical resistance tests after preservation, and the press life tests thereof were carried out similarly to Example 1 herein.

The results of the above-mentioned tests for Example 1 and Control Examples 1 to 3 are shown in Table 1 and Table 2, respectively. As is obvious from Table 1 and Table 2, it was found that the six-membered cyclic acid anhydride (i.e.; Exemplified Compound (1)) was greater in the sensitization effects than a five-membered cyclic acid-anhydride and that the processing chemical resistance and the press life thereof were not adversely affected by preservation. Table 1 indicates that the samples each containing a five-membered cyclic acid-anhydride became narrower in development latitude, while the sensitivity thereof was increased after preservation. On the other hand, the sample containing the six-membered cyclic acid-anhydride (i.e.; Exemplified Compound (1)) of the invention showed less fluctuation in sensitivity due to preservation and the development latitude thereof did not narrow.

TABLE 1

| | Suitable Exposure Time (Sensitivity) | | |
|---|---|---|---|
| | | The torture testing conditions | |
| | On the same day | 6-day preservation at the temperature of 55° C. and the humidity of 2% | 6-day preservation at the temperature of 40° C. and the humidity of 80% |
| Example-1 (The invention) | 45 sec. | 40 sec. | 45 sec. |
| Control Example-1 | 85 sec. | 88 sec. | 88 sec. |
| Control Example-2 | 70 sec. | 55 sec. | 48 sec. |
| Control Example-3 | 80 sec. | 65 sec. | 60 sec. |

In the above table, the contents of the cyclic acid-anhydride in the photosensitive compositions are the same amounts respectively in Example 1, Control Examples 2 and 3.

TABLE 2

|  | On the same day | | 6-day preservation at the temperature of 55° C. and the humidity of 2% | | 6-day preservation at the temperature of 40° C. and the humidity of 80% | |
|---|---|---|---|---|---|---|
|  | Chemical resistance | The number of prints | Chemical resistance | The number of prints | Chemical resistance | The number of prints |
| Example-1 (The invention) | ○ | 20 × 10⁴ shts | ○ | 20 × 10⁴ shts | ○ | 20 × 10⁴ shts |
| Control Example-1 | ○ | 20 × 10⁴ shts | ○ | 20 × 10⁴ shts | ○ | 20 × 10⁴ shts |
| Control Example-2 | ○ | 19 × 10⁴ shts | X | 15 × 10⁴ shts | Δ | 17 × 10⁴ shts |
| Control Example-3 | ○ | 19 × 10⁴ shts | X | 15 × 10⁴ shts | Δ | 18 × 10⁴ shts |

In the above table:
Mark ○ indicates no observation of any eroded image area, Mark Δ indicates the observation of a little eroded image area, and
Mark X indicates the observation of a seriously eroded image area.

EXAMPLE 2

A sheet of aluminium plate was grained in a brush graining treatment and then alkali-etched with sodium hydroxide solution. Subsequently an electrolytic graining surface treatment was applied an aqueous solution of nitric acid and another alkali-etching was preformed thereon with aqueous sodium hydroxide. Desmutting was then carried out, followed by anodizing in an aqueous solution of sulfuric acid resulting in Plate-2. The amount anodized 2 g/m².

Plate-2 to be used in a lithographic printing plate material, was coated, by means of a whirl coating machine, with the photosensitive solution having the following composition: then dried for four minutes at 100° C., and thus the lithographic printing plate material was obtained.

(Composition of photosensitive solution)
Esterified product of naphthoquinone-(1,2)-diazide-(2)-5-sulfonyl chloride and pyrogallol.acetone resin (which was described in Example 1 in U.S. Pat. No. 3,635,709)

| | |
|---|---|
| m-cresol.formaldehyde novolak resin | 3 g |
| Exemplified compound (1) | 7 g |
| p-t-butyl.formaldehyde novolak resin | 0.5 g |
| Oil-Blue #603 (mfd. by Orient Chemical Co.) | 0.15 g |
| Methyl cellosolve acetate | 0.2 g |
| | 100 g |

The amount coated by weight after drying was approx. 2.7 g/m².

Another lithographic printing plate material without the addition of Exemplified compound (1) was similarly prepared.

With respect to the lithographic printing plate materials thus prepared, the sensitivity measurements, the tests for chemical resistance and the press life after preservation were carried out similarly to Example 1. The results thereof were that the proper exposure times (i.e.; the sensitivity) were 50 seconds and 85 seconds respectively for that added with Exemplified compound (1) and the plate with Exemplified compound (1) added and the plate with this compound missing, while both of the plates were excellent in the chemical resistance and the press life.

EXAMPLE 3

The same aluminium plate as in Example 1 was coated similarly to Example 1 with the photosensitive solution having the following composition, and then dried to form the lithographic printing plate material.
(Composition of photosensitive solution)
Esterified products of naphthoquinone-(1,2)-diazide-(2)-5-sulfonyl chloride and m-cresol.formaldehyde novolak resin

| | |
|---|---|
| Condensation ratio: 25 mol % | 3.5 g |

Copolymeric condensation resin of phenol.m-, p-mixed cresol.formaldehyde (Molar ratio of phenol to cresol was 2:8 and the

| | |
|---|---|
| average molecular weight was 1300) | 8 g |
| Exemplified Compound (6) | 0.58 g |
| Victoria Pure Blue BOH (mfd. by Hodogaya Chemical Co.) | 0.2 g |
| Ethyl cellosolve | 100 g |

The amount coated after drying was approx. 2.5 g/m².

Another lithographic printing plate material without addition of Exemplified compound (6) was also prepared similarly in the above-mentioned formula.

With respect to the lithographic printing plate materials thus prepared, the sensitivity measurements, the tests for chemical resistance and the press life after preservation were carried out similarly to Example 1. The results thereof were that the suitable exposure times (i.e.; the sensitivity) were 60 seconds and 90 seconds respectively for the plate with Exemplified compound (6) added and absent, while both of the plates were excellent in chemical resistance and printing durability.

EXAMPLE 4

A lithographic printing plate material similar to that in Example 3 was obtained, except that Exemplified compound (4) was used in place of Exemplified compound (6).

With respect to the lithographic printing plate materials thus prepared, the sensitivity measurements, the tests for chemical resistance and the press life after preservation were carried out similarly to Example 1. The results thereof were that the suitable exposure time (i.e.; the sensitivity) was 55 seconds, and the chemical resistance and the press life thereof were excellent even after preservation.

EXAMPLE 5

3.96 g of acrylic anhydride and 40 mg of benzoyl peroxide were dissolved in 4 ml of dry benzene and the solution thus obtained was substituted by nitrogen, and then set in a sealed tube. Heat was applied thereto for two hours at 65° C. to solidify the contents. The contents thus solidified was dissolved in 100 ml of dry DMF. The resulting solution was poured into 500 ml of dry ether to precipitate the polymers. 3 g of, poly(acrylic anhydride) (i.e. exemplified compound (9)) was obtained by filtration and drying under reduced pressure. The average molecular weight thereof was 25,000.

The lithographic printing plate material was prepared using the same formula used in Example 3, except that 0.53 g of said poly(acrylic anhydride) of was used in place of Exemplified compound (6) used in Example 3.

The lithographic printing plate material thus obtained was tested for sensitivity, chemical resistance and press life similarly to Example 1. It was observed that the sensitivity thereof was as high as in Examples 3 and 4 and that the chemical resistance and the press life did not deteriorate even after preservation.

What is claimed is:

1. A photosensitive composition comprising in admixture a photosensitive o-quinone diazide compound, an alkali-soluble resin and a 6-membered cyclic acid anhydride wherein said anhydride is present in an amount of 0.5 to 20% by weight.

2. The photosensitive composition of claim 1, wherein said six-membered cyclic acid-anhydride is a compound represented by the Formula;

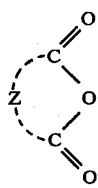

Formula [I]

wherein, Z represents a non-metallic atoms that is necessary for forming a six-membered ring together with

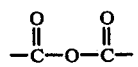

3. The photosensitive composition of claim 1, wherein said six-membered cyclic acid-anhydride is a compound represented by the Formula [II] or [III];

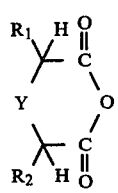

Formula [II]

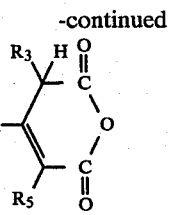

Formula [III]

wherein, Y represents an oxygen atom or a methylene group; $R_1$, $R_2$, $R_3$, $R_4$ and $R_5$ each represents a hydrogen atom, an alkyl, an aralkyl or an aryl group, or a halogen atom.

4. The photosensitive composition of claim 3, wherein Y represents a methylene group.

5. The photosensitive composition of claim 3, wherein said compound is glutaric anhydride.

6. The photosensitive composition of claim 1, wherein said six-membered cyclic acid-anhydride is a polymer having a monomer unit represented by the Formula [IV];

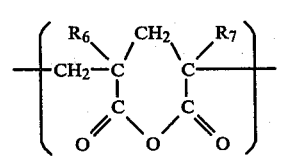

Formula [IV]

wherein, $R_6$ and $R_7$ each represents a hydrogen atom, a halogen atom or an alkyl group.

7. A photolithographic printing plate comprising a support and said composition of claim 1 coated thereon.

8. The plate of claim 7, wherein said six-membered cyclic acid-anhydride is a compound represented by the Formula [I];

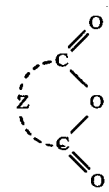

Formula [I]

wherein, Z represents a non-metallic atoms that is necessary for forming a six-membered ring together with

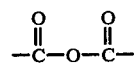

9. The plate of claim 7, wherein said six-membered cyclic acid-anhydride is a compound represented by the formula [II] or [III];

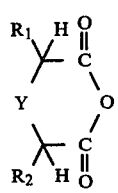

Formula [II]

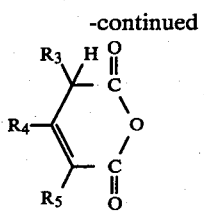

Formula [III]

wherein, Y represents an oxygen atom or a methylene group; $R_1$, $R_2$, $R_3$, $R_4$ and $R_5$ each represents a hydrogen atom, an alkyl, an aralkyl or an aryl group, or a halogen atom.

10. The plate of claim 9, wherein Y represents a methylene group.

11. The plate of claim 9, wherein said compound is glutaric anhydride.

12. The plate of claim 7, wherein said six-membered cyclic acid-anhydride is a polymer having a monomer unit represented by the Formula [IV];

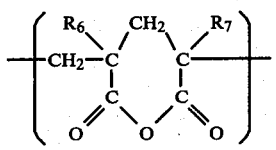

Formula [IV]

wherein, $R_6$ and $R_7$ each represents a hydrogen atom, a halogen atom or an alkyl group.

* * * * *